United States Patent
DiMaria et al.

(10) Patent No.: US 12,040,432 B2
(45) Date of Patent: Jul. 16, 2024

(54) LIGHT EMITTING DIODE DEVICES WITH PATTERNED TCO LAYER INCLUDING DIFFERENT THICKNESSES

(71) Applicant: Lumileds LLC, San Jose, CA (US)

(72) Inventors: Jeffrey DiMaria, San Jose, CA (US); Erik William Young, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 144 days.

(21) Appl. No.: 17/193,053

(22) Filed: Mar. 5, 2021

(65) Prior Publication Data

US 2022/0140198 A1    May 5, 2022

Related U.S. Application Data

(60) Provisional application No. 63/107,916, filed on Oct. 30, 2020.

(51) Int. Cl.
*H01L 33/42*    (2010.01)
*H01L 33/20*    (2010.01)

(52) U.S. Cl.
CPC ............ *H01L 33/42* (2013.01); *H01L 33/20* (2013.01); *H01L 2933/0016* (2013.01)

(58) Field of Classification Search
CPC .. H01L 33/42; H01L 33/20; H01L 2933/0016
See application file for complete search history.

(56) References Cited

U.S. PATENT DOCUMENTS

| | | | |
|---|---|---|---|
| 5,789,768 A | 8/1998 | Lee et al. | |
| 6,410,942 B1 | 6/2002 | Thibeault et al. | |
| 6,657,236 B1 | 12/2003 | Thibeault et al. | |
| 6,797,987 B2 | 9/2004 | Chen | |
| 6,821,804 B2 | 11/2004 | Thibeault et al. | |
| 7,943,406 B2 | 5/2011 | Slater, Jr. et al. | |
| 8,143,636 B2 | 3/2012 | Lin et al. | |
| 8,222,811 B2 | 7/2012 | Vaufrey et al. | |
| 8,258,044 B2 | 9/2012 | Brun et al. | |
| 8,487,340 B2 | 7/2013 | Gilet et al. | |

(Continued)

FOREIGN PATENT DOCUMENTS

| | | |
|---|---|---|
| DE | 102010051286 A1 | 5/2012 |
| DE | 102012109460 A1 | 4/2014 |

(Continued)

OTHER PUBLICATIONS

PCT International Search Report and Written Opinion in PCT/US2021/051172 dated Jan. 7, 2022, 10 pages.

*Primary Examiner* — William B Partridge
*Assistant Examiner* — David Paul Sedorook
(74) *Attorney, Agent, or Firm* — SERVILLA WHITNEY LLC

(57) ABSTRACT

Described are light emitting diode (LED) devices comprising a mesa with semiconductor layers, the semiconductor layers including an N-type layer, an active layer, and a P-type layer. A patterned transparent conductive oxide layer is on the top surface of the mesa. The patterned transparent conductive oxide layer has a first portion with a first thickness and a second portion with a second thickness, the second thickness less than the first thickness. Optical loss of the LED is reduced in the thinned region of the transparent conductive oxide layer.

21 Claims, 6 Drawing Sheets

(56) References Cited

U.S. PATENT DOCUMENTS

| | | |
|---|---|---|
| 8,638,032 B2 | 1/2014 | Maindron et al. |
| 8,647,957 B2 | 2/2014 | Borowik et al. |
| 8,697,548 B2 | 4/2014 | Borowik et al. |
| 8,698,396 B2 | 4/2014 | Maindron et al. |
| 8,728,285 B2 | 5/2014 | Demaray et al. |
| 8,754,426 B2 | 6/2014 | Marx et al. |
| 8,890,111 B2 | 11/2014 | Templier et al. |
| 8,969,900 B2 | 3/2015 | Sabathil et al. |
| 9,093,607 B2 | 7/2015 | Gilet et al. |
| 9,109,296 B2 | 8/2015 | Metaye et al. |
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,859,330 B2 | 1/2018 | Von Malm et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 2002/0139987 A1 | 10/2002 | Collins, III et al. |
| 2004/0031967 A1* | 2/2004 | Fudeta ............... H01L 33/32 257/79 |
| 2005/0093002 A1 | 5/2005 | Tsai et al. |
| 2007/0206130 A1 | 9/2007 | Wuu et al. |
| 2008/0099787 A1 | 5/2008 | Coolbaugh et al. |
| 2008/0142810 A1 | 6/2008 | Tompa et al. |
| 2008/0173884 A1 | 7/2008 | Chitnis et al. |
| 2008/0179602 A1 | 7/2008 | Negley et al. |
| 2010/0078656 A1 | 4/2010 | Seo et al. |
| 2011/0151607 A1 | 6/2011 | Landis et al. |
| 2011/0260203 A1 | 10/2011 | Lin et al. |
| 2011/0287606 A1 | 11/2011 | Brun et al. |
| 2012/0050694 A1 | 3/2012 | Huang et al. |
| 2012/0091481 A1 | 4/2012 | Sekine et al. |
| 2012/0205614 A1 | 8/2012 | Templier et al. |
| 2013/0020115 A1 | 1/2013 | Mataye et al. |
| 2013/0112945 A1 | 5/2013 | Gilet et al. |
| 2013/0256702 A1* | 10/2013 | Liu ..................... H01L 33/60 438/22 |
| 2013/0256708 A1 | 10/2013 | Jin et al. |
| 2013/0270514 A1 | 10/2013 | Saxler |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2015/0118544 A1 | 4/2015 | Oukassi |
| 2015/0144590 A1 | 5/2015 | Simonato et al. |
| 2015/0155439 A1* | 6/2015 | Cich .................. H01L 33/16 362/296.09 |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0218246 A1 | 7/2016 | Oraw et al. |
| 2016/0284935 A1 | 9/2016 | Wierer et al. |
| 2016/0293811 A1 | 10/2016 | Hussell et al. |
| 2016/0336483 A1 | 11/2016 | Shatalov et al. |
| 2016/0359094 A1* | 12/2016 | Tang ................... H01L 33/44 |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0293065 A1 | 10/2017 | Kim |
| 2017/0294418 A1 | 10/2017 | Edmond et al. |
| 2017/0309794 A1 | 10/2017 | Von Malm |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0130926 A1* | 5/2018 | Huang ................. H01L 33/14 |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2019/0326478 A1* | 10/2019 | Danesh ............... H01L 33/325 |
| 2020/0274029 A1* | 8/2020 | Schneider, Jr. ........ H01L 33/32 |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2013004546 A | 1/2013 |
| JP | 2016066765 A | 4/2016 |
| KR | 20140118466 A | 10/2014 |
| KR | 20170018687 A | 2/2017 |
| KR | 20180010670 A | 1/2018 |
| KR | 20180114413 A | 10/2018 |
| TW | 201417339 A | 5/2014 |
| TW | 201620163 A | 6/2016 |
| WO | 2011045289 A1 | 4/2011 |
| WO | 2011048318 A1 | 4/2011 |

(56) References Cited

FOREIGN PATENT DOCUMENTS

| | | |
|---|---|---|
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2016079505 A1 | 5/2016 |
| WO | 2017089676 A1 | 6/2017 |
| WO | 2017102708 A1 | 6/2017 |
| WO | WO2017184686 A | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019126539 A | 6/2019 |

* cited by examiner

LIGHT EMITTING DIODE DEVICES WITH PATTERNED TCO LAYER INCLUDING DIFFERENT THICKNESSES

CROSS-REFERENCE TO RELATED APPLICATIONS

This application claims priority to U.S. Provisional Application No. 63/107,916, filed Oct. 30, 2020, the entire disclosure of which is hereby incorporated by reference herein.

TECHNICAL FIELD

Embodiments of the disclosure generally relate to light emitting diode (LED) devices and methods of manufacturing the same. More particularly, embodiments are directed to light emitting diode devices that include a patterned transparent conductive oxide layer.

BACKGROUND

A light emitting diode (LED) is a semiconductor light source that emits visible light when current flows through it. LEDs combine a P-type semiconductor with an N-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$) or silicon carbide (SiC).

Various emerging display applications, including wearable devices, head-mounted, and large-area displays require miniaturized chips composed of arrays of microLEDs (μLEDs or uLEDs) with a high density having a lateral dimension down to less than 100 μm×100 μm. MicroLEDs (uLEDs) typically have dimensions of about 50 μm in diameter or width and smaller that are used to in the manufacture of color displays by aligning in close proximity microLEDs comprising red, blue and green wavelengths.

The drive to develop more efficient semiconductor optoelectronic devices has been facilitated by the employment of low loss optical materials and architectures. Typically, there is a trade-off between optical and electrical performance parameters in these devices that is associated with the electrical contact—better electrical properties usually result in higher optical loss, and vice versa. Transparent conductive oxides (TCOs) are one such class of material that have been explored to improve semiconductor light emitting device efficiency, as transparent conductive oxides can provide sufficient current spreading and electrical injection, while introducing relatively little optical loss with respect to a metallic contact. The development of these TCOs typically involves the optimization of film thickness and material parameters such that the desired optical and electrical properties are obtained for a given application, but the trade-off between optical and electrical properties is still fundamental. Accordingly, there is a need for LED devices having improved optoelectronic properties.

SUMMARY

Embodiments of the disclosure are directed to an LED device and methods for their manufacture. A first aspect pertains to a light emitting diode (LED) device comprising: a mesa comprising semiconductor layers, the semiconductor layers including an n-type layer, an active layer, and a p-type layer; a patterned transparent conductive oxide layer on a top surface of the mesa, the patterned transparent conductive oxide layer having a first portion with a first thickness and a second portion with a second thickness, the second thickness less than the first thickness; a dielectric layer on a top surface of the patterned transparent conductive oxide layer, the dielectric layer comprising at least one via opening, the at least one via opening having sidewalls and a bottom exposing a top surface of the first portion of the patterned transparent conductive oxide layer; and a contact on the dielectric layer and in electrical communication with the first portion of the patterned transparent conductive oxide layer.

Another aspect of the disclosure pertains to method of manufacturing a light emitting diode (LED) device comprising: depositing a transparent conductive oxide layer on a semiconductor surface; patterning the transparent conductive oxide layer to form a patterned transparent conductive oxide layer having first portion with a first thickness and a second portion with a second thickness; depositing a dielectric layer on the patterned transparent conductive oxide layer; forming a via opening in the dielectric layer; and forming a contact on the dielectric layer and in the via opening, the contact in electrical communication with the patterned transparent conductive oxide layer.

Another aspect of the disclosure pertains to a light emitting diode (LED) device comprising: a mesa comprising semiconductor layers, the semiconductor layers including an n-type layer, an active layer, and a p-type layer; a patterned transparent conductive oxide layer on a top surface of the mesa, the patterned transparent conductive oxide layer having a first portion with a first thickness and a second portion with a second thickness, the second thickness less than the first thickness, the patterned transparent conductive oxide layer comprising one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide, the first thickness is in a range of from about 1 nm to about 100 nm and the second thickness is in a range of from about 0 nm to about 50 nm; a dielectric layer on a top surface of the patterned transparent conductive oxide layer, the dielectric layer comprising at least one via opening, the at least one via opening having sidewalls and a bottom exposing a top surface of the first portion of the patterned transparent conductive oxide layer; and a contact on the dielectric layer and in electrical communication with the first portion of the patterned transparent conductive oxide layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

To facilitate understanding, identical reference numerals have been used, where possible, to designate identical elements that are common to the figures. The figures are not drawn to scale. For example, the heights and widths of the mesas are not drawn to scale.

DETAILED DESCRIPTION

Figure 1:
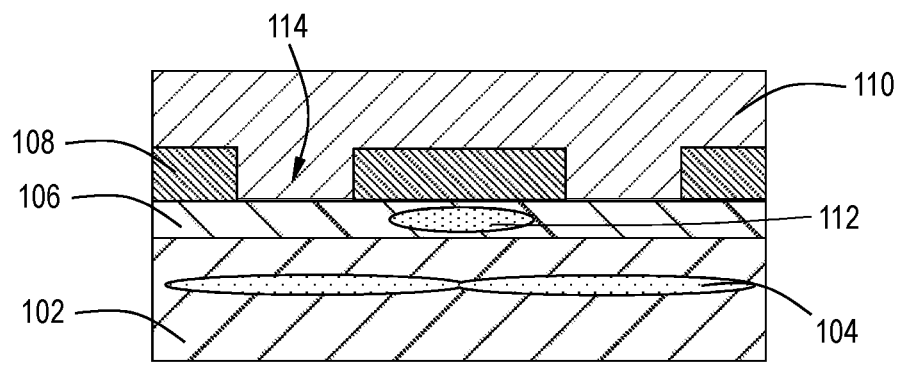
FIG. 1 illustrates a cross-sectional view of an LED device according to the prior art.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe LED devices and methods for forming LED devices. In particular, the present disclosure describes the lateral patterning of a transparent conductive oxide (TCO) layer to enhance the efficiency of light generation in the LED. In one or more embodiments, thinning the transparent conductive oxide (TCO) layer increases the resistivity of the exposed regions and reduces optical absorption in the light emitting device due to a reduction in the optical path through the material. In one or more embodiments, this effect can be employed to increase carrier densities in regions of the device where efficiency is dominated by low-current density related non-radiative recombination, reduce carrier densities in regions of a device where efficiency is dominated by high-current density related non-radiative recombination, and screen carriers away from regions where it is known that non-radiative recombination dominates such as at sidewall regions where etch damage has occurred. In many cases, the forward voltage increase that occurs through the reduction of the transparent conductive oxide (TCO) layer is offset by the increase in internal quantum efficiency (IQE) and optical efficiency.

The transparent conductive oxide layer of one or more embodiments includes, but is not limited to, indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide.

The lateral patterning of the transparent conductive oxide layer can take on several embodiments. In one or more embodiments, the transparent conductive oxide layer can be partially or fully absent from certain regions. The modified regions of one or more embodiments can be placed with a periodic spacing, or a spacing similar to an eVia spacing. In one or more embodiments, the modified regions of the transparent conductive oxide layer can also be placed in a non-uniform way to force current from areas of high current density to areas of lower current density, e.g. placed at the edge of the die or near nVias in order to force current into areas of the transparent conductive oxide layer away from metallic edge contacts (if present) or metallic current-carrying vias (either hole injection or electrical injection).

In one or more embodiments, the transparent conductive oxide layer can be deposited on the n or p type semiconductor surface using a physical vapor deposition process (electron beam, ion-assisted electron beam, thermal evaporation, DC and RF sputtering, and the like), a chemical vapor deposition process (PECVD), an atomic layer deposition (ALD) process, or grown epitaxially (MOCVD, MBE). In one or more embodiments, the deposition could occur before or after patterning of the sample surface and would either undergo an etch process or liftoff process to achieve the desired pattern. In one or more embodiments, where an etch process is involved, the transparent conductive oxide layer can be etched using standard dry etch processes such as reactive ion, inductively coupled plasma, ion-beam etch, and the like. Etch gasses can include argon ($Ar_2$), sulfur hexafluoride ($SF_6$), fluoroform ($CHF_3$), nitrogen ($N_2$), chlorine ($Cl_2$), boron trichloride ($BCl_3$), and the like, and combinations thereof. In one or more embodiments, etch masks include photolithographic polymers as well as metallic and dielectric hardmasks.

In one or more embodiments, the transparent conductive oxide (TCO) layer can be improved by surface treatments including, but not limited to, dry etch processes, which can utilize either reactive or non-reactive etch methods (ICP, RIE, and the like) and chemistries that include any combination of various reactive (oxygen ($O_2$), chlorine ($Cl_2$), boron trichloride ($BCl_3$), sulfur hexafluoride ($SF_6$), fluoroform ($CHF_3$), nitrogen ($N_2$)) and/or non-reactive (Argon ($Ar_2$)) gasses, wet chemical treatments that include any combination of various chemistries (hydrochloric acid (HCl), hydrofluoric acid (HF), BOE, ammonium:hydrogen peroxide ($NH_4:H_2O_2$), hydrochloric acid:hydrogen peroxide ($HCl:H_2O_2$), and other photoresist strip chemistries).

In one or more embodiments, treatment can also include the deposition of silicon oxide ($SiO_2$), silicon nitride (SiN), gallium nitride (GaN), and/or zinc oxide (ZnO) films after the surface treatments to passivate or improve the electrical or optical properties of the transparent conductive oxide (TCO) layer surface. The transparent conductive oxide (TCO) layer may or may not be thermally annealed after thin film deposition. In one or more embodiments, the deposited thin films may be partially or completely removed with a dry or wet etch process to re-expose the transparent conductive oxide (TCO) layer surface.

In one or more embodiments, two or more additional transparent conductive oxide (TCO) layers can be stacked, and these layers can also be subsequently patterned, either partially or fully. The patterning may occur before or after the additional layers are deposited.

FIG. 1 is a cross-sectional view an LED device according to the prior art. FIG. 1 depicts the current spreading and light generation distribution inside an LED of the prior art. With reference to FIG. 1, semiconductor layers 102 are grown on a substrate (not illustrated). A transparent conductive oxide layer 106 is on a top surface of the semiconductor layers 102. A dielectric layer 108 is on the transparent conductive oxide layer 106. The dielectric layer has at least one opening 114. The opening 114 may be referred to as an eVia. A contact metal 110 is on a top surface of the dielectric layer 108 and fills the opening(s) 114. According to the prior art, current flows through the opening 114 and into the transparent conductive oxide layer 106 where is spreads laterally. Light is then generated in the semiconductor layers 102 in a generation region 104 and may be absorbed in an absorption region 112 of the transparent conductive oxide layer 106.

With reference to FIG. 1, the role of the electrical contact, whether metallic 110 or transparent conductive oxide layer 106, is to inject current efficiently into the active region of the semiconductor layers 102 light emitting device while minimizing optical and non-radiative recombination losses. Due to device-specific details, such as finite contact area and a large mismatch between carrier mobility between that of the contact and the semiconductor, the lateral current spreading across the semiconductor can be non-uniform. Non-uniform carrier injection may not be advantageous to the functioning of the semiconductor light emitting device.

Accordingly, one or more embodiments advantageously provide an LED device having a thinned or locally removed transparent conductive oxide (TCO) layer. In other embodiments, the electrical properties of the transparent conductive oxide (TCO) layer are advantageously modified by chemical processing. In one or more embodiments, by locally removing or thinning the transparent conductive oxide (TCO) layer, or by chemically modifying the electrical properties of the transparent conductive oxide (TCO) layer, the desired electrical and optical properties can be obtained to optimize the device performance for a given application.

The transparent conductive oxide (TCO) layer of one or more embodiments can be used for higher electrical and optical efficiency of light emitting diodes and diode lasers. In some embodiments, applications which require high current operation and high internal quantum efficiency, as is the case in standard LED die, a particularly suited to the transparent conductive oxide (TCO) layer of one or more embodiments. In these cases, full utilization of the entire light emitting area is advantageous, however the trade-off between the conductivities of the contact, the transparent conductive oxide (TCO) layer of one or more embodiments, and the semiconductor may result in underutilization of areas of the light emitting region such that they operate below peak in internal quantum efficiency (IQE). According to one or more embodiments, lateral patterning of the transparent conductive oxide (TCO) layer can reduce carrier injection into device regions with high carrier densities, which do not operate close to peak internal quantum efficiency, and force carriers into underutilized areas, where current density is lower, having the effect of improving the overall IQE. Despite a higher forward voltage that may result from an increase in the overall transparent conductive oxide (TCO) layer resistance, this can be offset by lower optical losses due to a reduction in transparent conductive oxide (TCO) layer thickness or area. In one or more embodiments, the patterning can be done in such a way as to reduce optical loss while maintaining low voltage frequency (Vf).

In other embodiments, the transparent conductive oxide (TCO) layer can be used for applications which require low current operation and high internal quantum efficiency. For such applications, the electrically injected current may be limited by the power supply, or devices may require low power operation to ensure high device lifetime. In the latter case, heat extraction from such devices may be limited due to size or packaging constraints. In these cases, the LED may be operating in a low current regime that is dominated by non-radiative recombination processes, such as Shockley Read Hall recombination. In one or more embodiments, the lateral patterning of the transparent conductive oxide (TCO) layer and/or metal contact can increase the internal quantum efficiency of such devices by increasing the current density for a given injection current such that trap states recombination is overtaken by radiative recombination, and the device operates close to peak IQE.

In some embodiments, the transparent conductive oxide (TCO) layer can be used for applications which require high internal quantum efficiency but have known regions of high non-radiative recombination. One example is in the case of a micro-LED (μLED) with sidewalls that have etch damage and that also have high sidewall area relative to the diode lateral area. Non-radiative recombination at these sidewalls will be higher than in the center of the LED and will negatively impact internal quantum efficiency. In one or more embodiments, internal quantum efficiency can be improved by reducing or eliminating carrier injection (and carrier interaction) with these low efficiency regions by patterning the transparent conductive oxide layer/contact such that it is removed from or its resistivity is increased in these regions.

Figure 2:
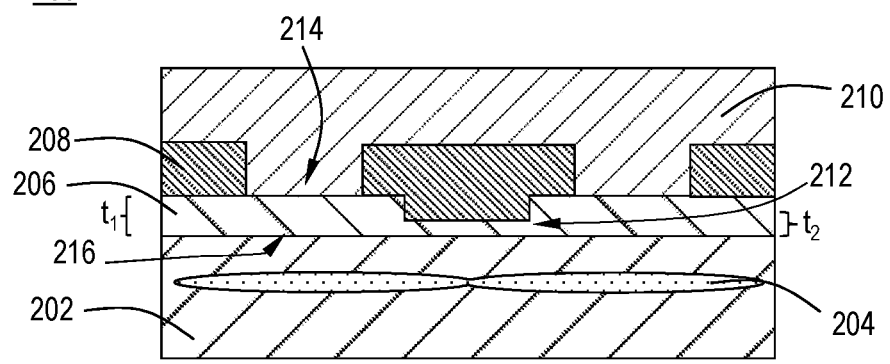
FIG. 2 illustrates a cross-sectional view of an LED device according to one or more embodiments.

FIG. 2 is a cross-sectional view an LED device according to one or more embodiments. With reference to FIG. 2, semiconductor layers 202 are grown on a substrate (not illustrated). The semiconductor layers 202 may comprise epitaxial layers, III-nitride layers or epitaxial III-nitride layers. In one or more embodiments, the semiconductor layers are epitaxial semiconductor layers having a thickness at least 1 micron.

The substrate may be any substrate known to one of skill in the art. In one or more embodiments, the substrate comprises one or more of sapphire, silicon carbide, silicon (Si), quartz, magnesium oxide (MgO), zinc oxide (ZnO), spinel, and the like. In one or more embodiments, the substrate is not patterned prior to the growth of the Epi-layer. Thus, in some embodiments, the substrate is not patterned and can be considered to be flat or substantially flat. In other embodiments, the substrate is patterned, e.g. patterned sapphire substrate (PSS).

In one or more embodiments, the semiconductor layers 202 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 202 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 102 comprise a p-type layer, an active region, and an n-type layer. In specific embodiments, the n-type layer and p-type layer of the LED comprise n-doped and p-doped GaN.

In one or more embodiments, the layers of III-nitride material which form the LED are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD). In other embodiments, the substrate is placed in a metalorganic vapor-phase epitaxy (MOVPE) reactor for epitaxy of LED device layers to grow the semiconductor layers 202.

"Sputter deposition" as used herein refers to a physical vapor deposition (PVD) method of thin film deposition by sputtering. In sputter deposition, a material, e.g. a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step maybe conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, the semiconductor layers 202 comprise a stack of undoped III-nitride material and doped III-nitride material. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In specific embodiments, the semiconductor layers 202 comprise an n-type layer, an active layer, and a p-type layer.

In one or more embodiments, the semiconductor layers 202 have a combined thickness in a range of from about 1 μm to about 10 μm, including a range of from about 1 μm to about 9 μm, 1 μm to about 8 μm, 1 μm to about 7 μm, 1 μm to about 6 μm, 1 μm to about 5 μm, 1 μm to about 4 μm, 1 μm to about 3 μm, 2 μm to about 10 μm, including a range of from about 2 μm to about 9 μm, 2 μm to about 8 μm, 2 μm to about 7 μm, 2 μm to about 6 μm, 2 μm to about 5 μm, 2 μm to about 4 μm, 2 μm to about 3 μm, 3 μm to about 10 μm, 3 μm to about 9 μm, 3 μm to about 8 μm, 3 μm to about 7 μm, 3 μm to about 6 μm, 3 μm to about 5 μm, 3 μm to about 4 μm, 4 μm to about 10 μm, 4 μm to about 9 μm, 4 μm to about 8 μm, 4 μm to about 7 inn, 4 μm to about 6 μm, 4 μm to about 5 μm, 5 μm to about 10 μm, 5 μm to about 9 μm, 5 μm to about 8 μm, 5 μm to about 7 μm, 5 μm to about 6 μm, 6 μm to about 10 μm, 6 μm to about 9 inn, 6 μm to about 8 μm, 6 μm to about 7 μm, 7 μm to about 10 μm, 7 μm to about 9 μm, or 7 inn to about 8 μm.

In some embodiments, not illustrated, the semiconductor layers 202 are etched to form a mesa. The mesa may have has a top surface and at least one side wall. The at least one side wall may define a trench having a bottom surface. In one or more embodiments, the trench has a depth from a top surface of the semiconductor layers 202 forming the mesa in a range of from about 0.5 μm to about 2 μm.

With reference to FIG. 2, a transparent conductive oxide layer 206 is on a top surface of the semiconductor layers 202. In one or more embodiments, the transparent conductive oxide layer 206 is on a top surface of the mesa, the mesa comprising semiconductor layers 202. In one or more embodiments, the transparent conductive oxide layer 206 is patterned. As used herein, the term "patterned" refers to enhancing a feature density of a surface.

In one or more embodiments the transparent conductive oxide (TCO) layer 206 is thinned or removed in a region. In some embodiments, the transparent conductive oxide layer 206 is thinner or partially removed from a low current density region, thus reducing optical loss in the thinned region. In other embodiments, the electrical properties of the transparent conductive oxide (TCO) layer 206 are modified by chemical processing. In one or more embodiments, the transparent conductive oxide layer 206 has a first portion 216 with a first thickness, $t_1$, and a second portion 212 with a second thickness, $t_2$. In one or more embodiments, the second thickness, $t_2$, is less than the first thickness, $t_1$.

In one or more embodiments, the first thickness, $t_1$, is in a range of from about 1 nm to about 500 nm, including a range of from about 5 nm to about 500 nm, a range of from about 10 nm to about 500 nm, a range of from about 10 nm to about 400 nm, a range of from about 100 nm to about 500 nm.

In one or more embodiments, the second thickness, $t_2$, is in a range of from about 0 nm to about 500 nm, including a range of from about 0 nm to about 400 nm, a range of from about 0 nm to about 300 nm, a range of from about 0 nm to about 200 nm, a range of from about 0 nm to about 100 nm, and a range of from about 0 nm to about 50 nm. In some embodiments, the second portion 212 has a width in a range of about 1 micron to about 30 microns, or in a range of about 1 micron to about 25 microns, or in a range of about 1 micron to 20 microns. In some embodiments, the width of the second portion 212 is equal to the width of the opening 214 (i.e. the width of the eVia).

In one or more embodiments, the transparent conductive oxide layer 206 comprises one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide.

In one or more embodiments, the transparent conductive oxide layer 206 can be chemically or physically modified. In some embodiments, such chemical and physical modification techniques include treatments such dry etch processes, which can utilize either reactive or non-reactive etch methods (e.g. inductively couple plasma (ICP), reactive ion etching (RIE), and the like) and chemistries that include any combination of various reactive oxygen ($O_2$), chlorine ($Cl_2$), boron trichloride ($BCl_3$), sulfur hexafluoride ($SF_6$), fluoroform ($CHF_3$), nitrogen ($N_2$)) and/or non-reactive (Argon ($Ar_2$)) gasses, wet chemical treatments that include any combination of various chemistries (hydrochloric acid (HCl), hydrofluoric acid (HF), BOE, ammonium:hydrogen peroxide ($NH_4$:$H_2O_2$), hydrochloric acid:hydrogen peroxide (HCl:$H_2O_2$), and other photoresist strip chemistries).

In one or more embodiments, treatment can also include the deposition of silicon oxide ($SiO_x$), silicon nitride (SiN), gallium nitride (GaN), and zinc oxide (ZnO) films after the surface treatments to passivate or improve the electrical or optical properties of the transparent conductive oxide (TCO) surface. The transparent conductive oxide (TCO) may or may not be thermally annealed after thin film deposition. The deposition of the thin films may be partially or completely removed with a dry or wet etch process to re-expose the transparent conductive oxide (TCO) surface.

In one or more embodiments, a dielectric layer 208 is on the transparent conductive oxide layer 206. The dielectric layer 208 has at least one opening 214. In some embodiments, the opening 214 may be referred to as an eVia. In one or more embodiments, the opening 214 has a width in a range of about 1 micron to about 30 microns, or in a range of about 1 micron to about 25 microns, or in a range of about 1 micron to about 20 microns.

In one or more embodiments, the dielectric layer has a thickness greater than about 300 nm, or greater than about 500 nm, or greater than about 1000 nm. As used herein, the term "dielectric" refers to an electrical insulator material that can be polarized by an applied electric field. In one or more embodiments, the dielectric material may comprise any suitable material known to the skilled artisan. In some embodiments, the dielectric material comprises one of more of silicon nitride (SiN), titanium oxide ($TiO_x$), niobium oxide ($NbO_x$), aluminum oxide ($AlO_x$), hafnium oxide ($HfO_x$), tantalum oxide ($TaO_x$), aluminum nitride (AlN), silicon oxide ($SiO_x$), and hafnium-doped silicon dioxide ($HfSiO_x$). While the term "silicon oxide" may be used to describe the dielectric layer 208, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio.

In one or more embodiments, a contact metal 210 is on a top surface of the dielectric layer 206 and fills the opening(s) 214. In one or more embodiments, the contact metal 210 may comprise any suitable material known to the skilled artisan. In one or more embodiments, the contact metal 210 comprises a p-contact material selected from one or more of silver (Ag), gold (Au), platinum (Pt), and palladium (Pd). In some embodiments, additional metals may be added in small quantities to the p-contact as adhesion promoters. Such adhesion promoters, include, but are not limited to, one or more of nickel (Ni), titanium (Ti), and chromium (Cr). In other embodiments, a transparent conductive oxide (TCO) may be used as a p-contact material, such as, but not limited to, indium tin oxide (ITO) and zinc oxide (ZnO). In other embodiments, the contact metal 210 comprises an n-contact material selected from one or more of copper (Cu) and aluminum (Al). In one or more embodiments, the contact metal 210 comprises a material selected from one or more of silver (Ag), aluminum (Al), gold (Au), copper (Cu), palladium (Pd), and platinum (Pt).

In one or more embodiments, current flows through the opening(s) 214 and passes through the transparent conductive oxide layer 206 without being absorbed because of the thinner second portion 212. In one or more embodiments, light is then generated in the semiconductor layers 202 in a generation region 204. In one or more embodiments, optical loss is reduced in the second portion 212 of the transparent conductive oxide layer 206.

Figure 3:
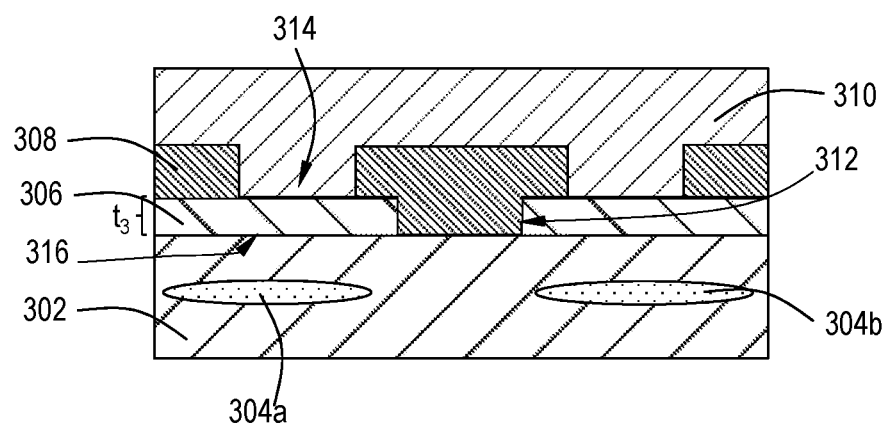
FIG. 3 illustrates a cross-sectional view of an LED device according to one or more embodiments.

With reference to FIG. 3, a transparent conductive oxide layer 306 is on a top surface of the semiconductor layers 302. In one or more embodiments, the transparent conductive oxide layer 306 is on a top surface of the mesa, the mesa comprising semiconductor layers 302. In one or more embodiments, the transparent conductive oxide layer 306 is patterned.

In one or more embodiments the transparent conductive oxide (TCO) layer 306 is removed in a region. In some embodiments, the transparent conductive oxide layer 306 is removed completely from a low current density region, thus eliminating optical loss in the removed region. In other embodiments, the electrical properties of the transparent conductive oxide (TCO) layer 306 are modified by chemical processing. In one or more embodiments, the transparent conductive oxide layer 306 has a first portion 316 with a thickness, $t_3$, and a second portion 312. In one or more embodiments, second portion 312 comprises a gap or an area where there is no transparent conductive oxide (TCO) layer 306. Accordingly, in some embodiments, the dielectric layer 308 is in contact with the top surface of the semiconductor layers 302.

In one or more embodiments, the thickness, $t_3$, is in a range of from about 1 nm to about 500 nm, including a range of from about 5 nm to about 500 nm, a range of from about 10 nm to about 500 nm, a range of from about 10 nm to about 400 nm, a range of from about 100 nm to about 500 nm.

In some embodiments, the second portion 312 (i.e. the gap) has a width in a range of about 1 micron to about 30 microns, or in a range of about 1 micron to about 25 microns, or in a range of about 1 micron to 20 microns. In some embodiments, the width of the second portion 212 is equal to the width of the opening 314 (i.e. the width of the eVia).

In one or more embodiments, the transparent conductive oxide layer 306 comprises one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide.

In one or more embodiments, the transparent conductive oxide layer 306 can be chemically or physically modified. In some embodiments, such chemical and physical modification techniques include treatments such dry etch processes, which can utilize either reactive or non-reactive etch methods (e.g. inductively couple plasma (ICP), reactive ion etching (RIE), and the like) and chemistries that include any combination of various reactive oxygen ($O_2$), chlorine ($Cl_2$), boron trichloride ($BCl_3$), sulfur hexafluoride ($SF_6$), fluoroform ($CHF_3$), nitrogen ($N_2$)) and/or non-reactive (Argon ($Ar_2$)) gasses, wet chemical treatments that include any combination of various chemistries (hydrochloric acid (HCl), hydrofluoric acid (HF), BOE, ammonium:hydrogen peroxide ($NH_4$:$H_2O_2$), hydrochloric acid:hydrogen peroxide (HCl:$H_2O_2$), and other photoresist chemistries).

In one or more embodiments, treatment can also include the deposition of silicon oxide ($SiO_x$), silicon nitride (SiN), gallium nitride (GaN), and zinc oxide (ZnO) films after the surface treatments to passivate or improve the electrical or optical properties of the transparent conductive oxide (TCO) surface. The transparent conductive oxide (TCO) may or may not be thermally annealed after thin film deposition. The deposition of the thin films may be partially or completely removed with a dry or wet etch process to re-expose the transparent conductive oxide (TCO) surface.

In one or more embodiments, a dielectric layer 308 is on the transparent conductive oxide layer 306. The dielectric layer 308 has at least one opening 314. In some embodiments, the opening(s) 314 may be referred to as an eVia. In one or more embodiments, the opening(s) 314 has a width in a range of about 1 micron to about 30 microns, or in a range of about 1 micron to about 25 microns, or in a range of about 1 micron to about 20 microns.

In one or more embodiments, the dielectric layer 308 has a thickness greater than about 300 nm, or greater than about 500 nm, or greater than about 1000 nm. In one or more embodiments, the dielectric layer 308 may comprise any suitable material known to the skilled artisan. In some embodiments, the dielectric layer 308 comprises one of more of silicon nitride (SiN), titanium oxide ($TiO_x$), niobium oxide ($NbO_x$), aluminum oxide ($AlO_x$), hafnium oxide ($HfO_x$), tantalum oxide ($TaO_x$), aluminum nitride (AlN), silicon oxide ($SiO_x$), and hafnium-doped silicon dioxide ($HfSiO_x$).

In one or more embodiments, a contact metal 310 is on a top surface of the dielectric layer 308 and fills the opening(s) 314. In one or more embodiments, the contact metal 310 may comprise any suitable material known to the skilled artisan. In one or more embodiments, the contact metal 310 comprises a p-contact material selected from one or more of silver (Ag), gold (Au), platinum (Pt), and palladium (Pd). In some embodiments, additional metals may be added in small quantities to the p-contact as adhesion promoters. Such adhesion promoters, include, but are not limited to, one or more of nickel (Ni), titanium (Ti), and chromium (Cr). In other embodiments, a transparent conductive oxide (TCO) may be used as a p-contact material, such as, but not limited to, indium tin oxide (ITO) and zinc oxide (ZnO). In other embodiments, the contact metal 310 comprises an n-contact material selected from one or more of copper (Cu) and aluminum (Al). In one or more embodiments, the contact metal 310 comprises a material selected from one or more of silver (Ag), aluminum (Al), gold (Au), copper (Cu), palladium (Pd), and platinum (Pt).

In one or more embodiments, current flows through the opening(s) 314 and passes through the transparent conductive oxide layer 306 without being absorbed because of the absent second portion 312. In one or more embodiments, light is then generated in the semiconductor layers 302 in multiple generation regions 304a, 304b. In one or more embodiments, optical loss is eliminated in the second portion 312 of the transparent conductive oxide layer 306 because the transparent conductive oxide layer 306 is removed/absent in the second portion 312.

Figure 4A:
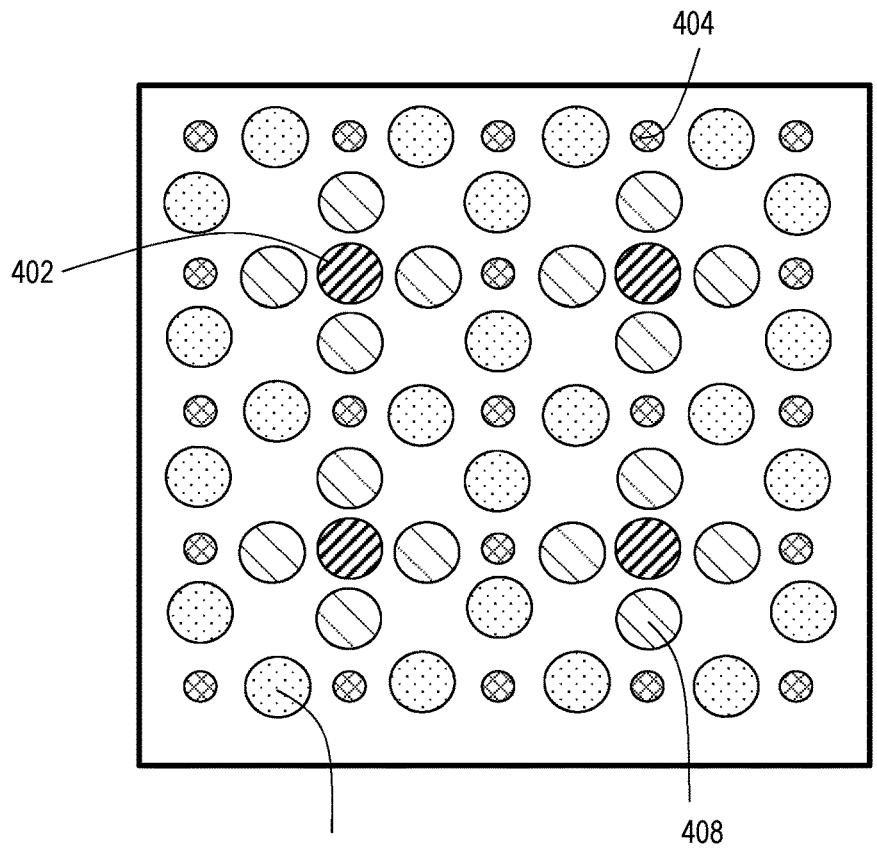
FIGS. 4A to 4F illustrate current maps according to one or more embodiments.

FIGS. 4A to 4F illustrate current maps according to one or more embodiments. Referring to FIG. 4A, a device 400 has one or more n-type contacts 402 and one or more p-type contacts 404, and non-optimal low current region 406 and a non-optimal high current region 408. As used herein, the term "non-optimal" refers to the local IQE having a value that is not near the maximum value. The IQE value is dependent upon the local current density injected into the underlying light emitting region, which is strongly correlated with the TCO current density. The maximum IQE typically occurs at some moderate current density and is reduced at lower and higher current density. When the patterned transparent conductive oxide (TCO) layer of one or more embodiments is used, the current regions can be modulated such that the high and low current regions become moderate current regions where the IQE is maximized.

Figure 4B:
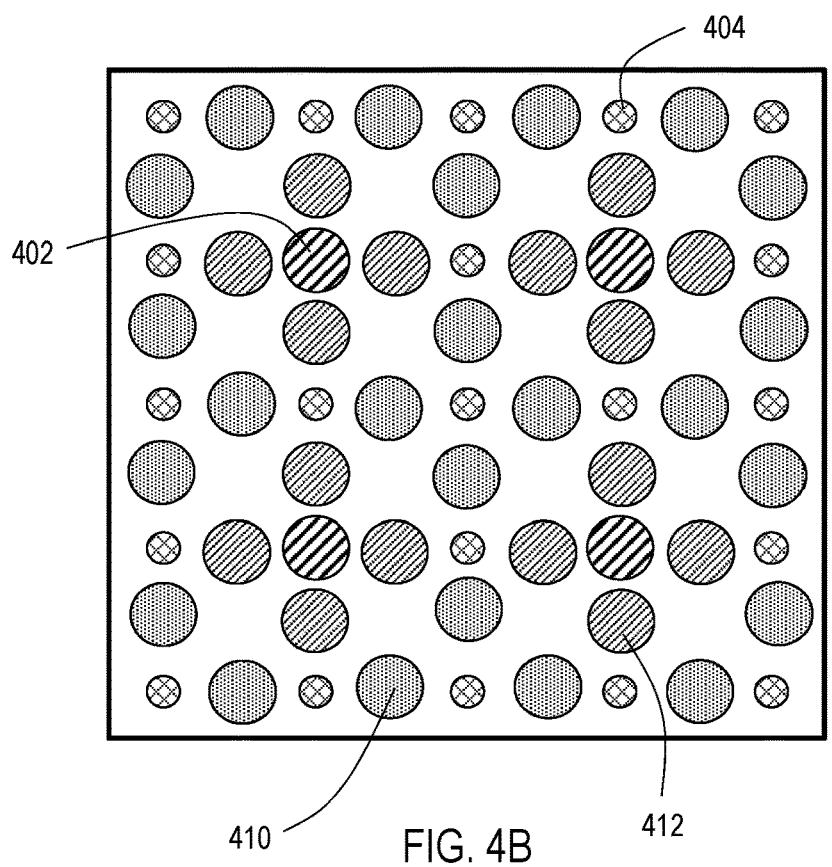

For example, referring to FIG. 4B, there may be an optimal moderate current region 410 and transparent conductive oxide modified region 412. The transparent conductive oxide modified region 412 may have a transparent conductive oxide layer that is reduced, removed, or has lower conductivity and lower optical absorption due to chemical modification. This has the effect of reducing the optical loss associated with the volume of TCO removed or modified while maintaining the same electrical and IQE properties of the light emitting region, thereby improving the device efficiency.

Figure 4C:
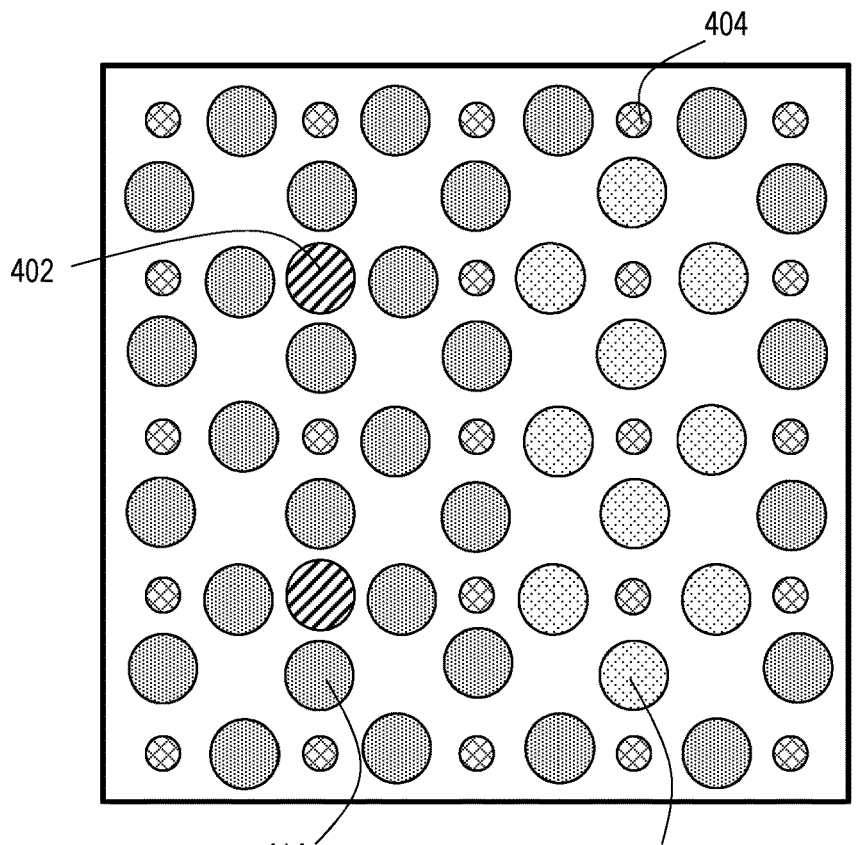
Figure 4D:
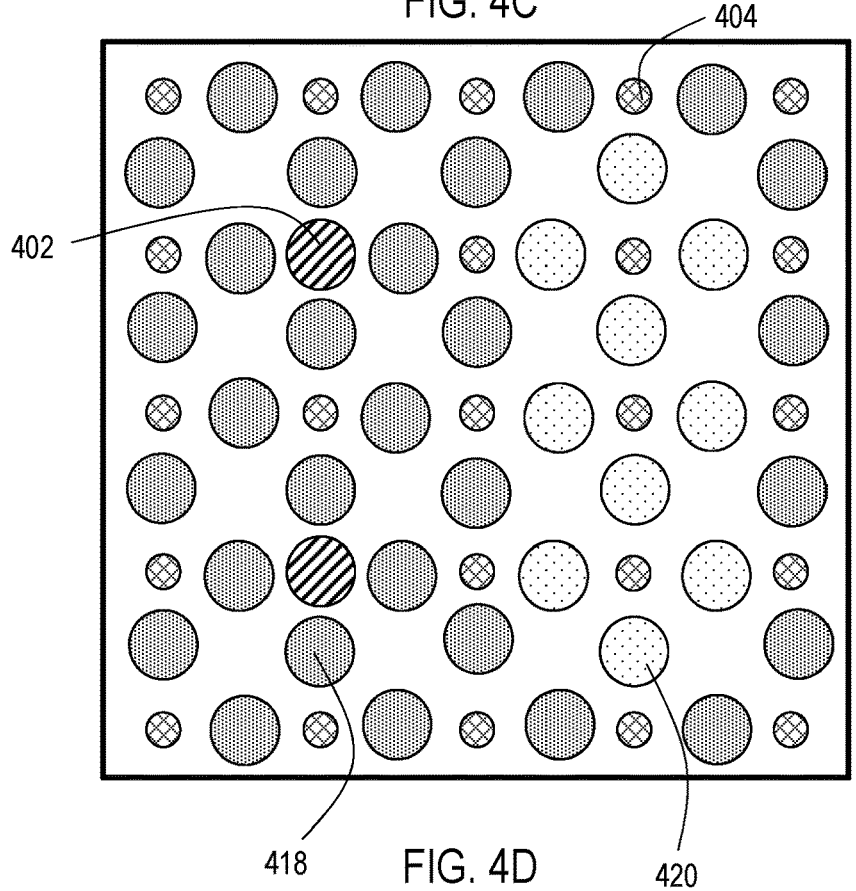

With reference to FIG. 4C, there may be an optimal moderate current region 414 and a non-optimal low current region 416. When the patterned transparent conductive oxide (TCO) layer of one or more embodiments is used, referring to FIG. 4D, there is an optimal current density transparent conductive oxide (TCO) region 418 and patterned transparent region 420. In this example, the TCO layer was modified primarily to reduce the optical loss associated with the modified TCO while minimally impacting the electrical performance of the device, or the IQE of the light emitting region.

Figure 4E:
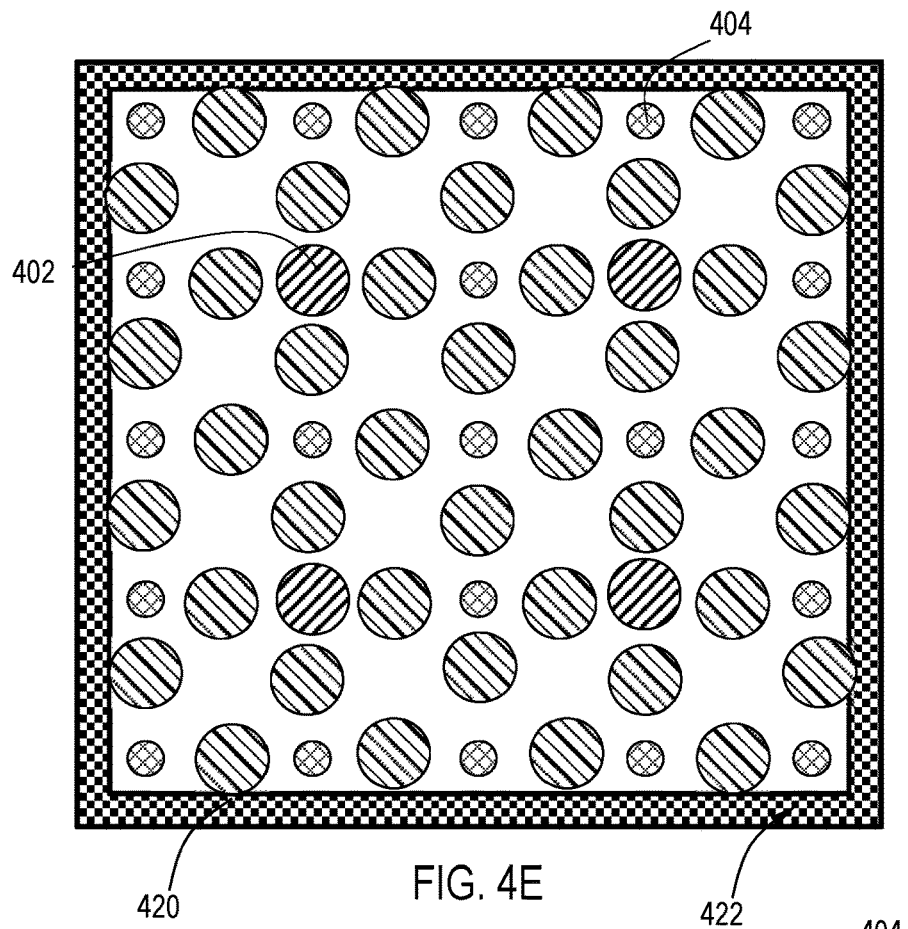
Figure 4F:
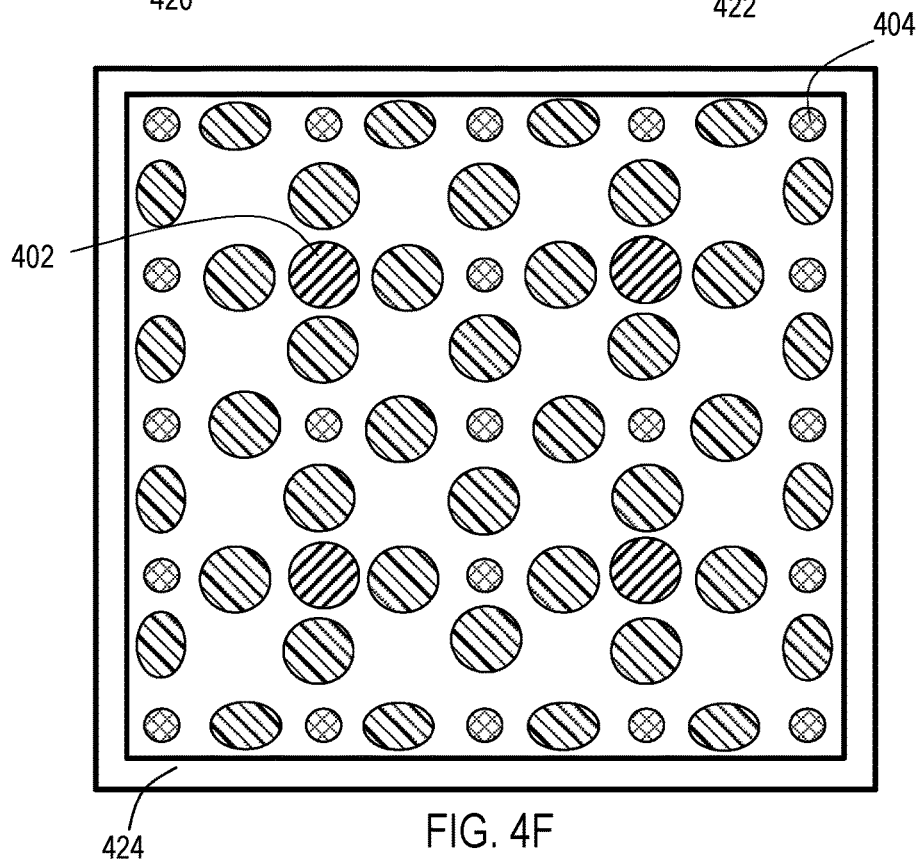

With reference to FIGS. 4E and 4F, carrier interactions at interface 420 have reduced quantum efficiency, and region 422 is a low efficiency region. When the patterned transparent conductive oxide (TCO) layer of one or more embodiments is used, referring to FIG. 4F, there is a patterned transparent conductive oxide (TCO) region 424 resulting in no carrier interaction. This has the effect of improving the entire device efficiency by preventing carriers from interacting with this region, and reducing the optical loss associated with the removed volume of TCO.

Figure 5:
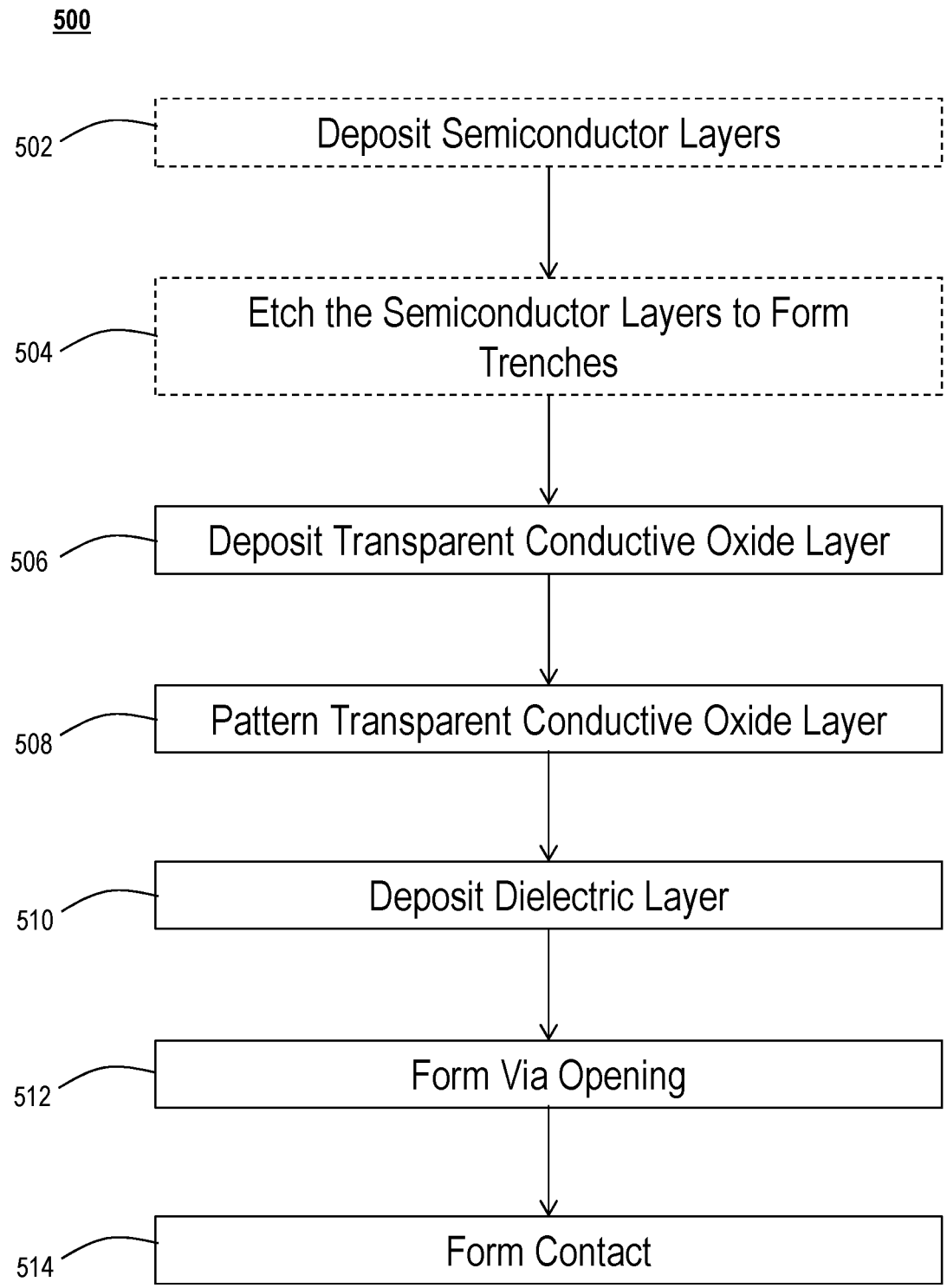
FIG. 5 illustrates a process flow diagram of a method according to one or more embodiments.

FIG. 5 illustrates a process flow diagram of a method of manufacturing an LED device according to one or more embodiments. In one or more embodiments, a method of manufacturing a light emitting diode (LED) device begins at operation 502 where semiconductors layers are deposited or grown on a substrate. At operation 504, the semiconductor layers are etched for form at least one mesa having a top surface and at least one sidewall. In some embodiments, the sidewall may define a trench having a depth and a bottom surface. At operation 506, a transparent conductive oxide layer is deposited on the semiconductor surface. In one or more embodiments, at operation 508, the transparent conductive oxide layer is patterned to form a patterned transparent conductive layer having a first portion with a first thickness and a second portion with a second thickness. In one or more embodiments, the first thickness is in a range of from about 1 nm to about 500 nm and the second thickness is in a range of from about 0 nm to about 500 nm.

At operation 510, a dielectric layer is deposited on the patterned transparent conductive layer. At operation 512, a via opening is formed in the dielectric layer. In one or more embodiments, the via opening has at least one sidewall and a bottom surface, the bottom surface comprising a top surface of the first portion of the patterned transparent conductive layer. In one or more embodiments, the second portion of the transparent conductive oxide has a width in a range of about 2 microns to about 30 microns.

At operation 514, a contact is formed on the dielectric layer and in the via opening. In one or more embodiments, the contact is in electrical communication with the patterned transparent conductive oxide layer.

In some embodiments, the method 500 further comprises treating the patterned transparent conductive oxide layer with one or more of a dry etch treatment and a chemical treatment. In one or more embodiments, the chemical treatment comprises treatment with one or more of oxygen ($O_2$), chlorine ($Cl_2$), boron trichloride ($BCl_3$), sulfur hexafluoride ($SF_6$), fluoroform ($CHF_3$), nitrogen ($N_2$), argon ($Ar_2$), hydrochloric acid (HCl), hydrofluoric acid (HF), buffered oxide etchant, ammonia ($NH_4$), hydrogen peroxide ($H_2O_2$), and photoresist stripping chemicals.

In one or more embodiments, the method 500 further comprises depositing a film on the patterned transparent conductive oxide layer prior to deposition of the dielectric layer, the film comprising one or more of silicon oxide ($SiO_x$), silicon nitride (SiN), gallium nitride (GaN), and zinc oxide (ZnO). In some embodiments, the patterned transparent conductive oxide layer can be annealed. In other embodiments, a second transparent conductive oxide layer is deposited on the transparent conductive oxide layer, and the second transparent conductive oxide layer is patterned.

Another aspect of the disclosure pertains to an electronics system. In one or more embodiments, an electronic system comprises the LED devices and arrays described herein and driver circuitry configured to provide independent voltages to one or more of p-contact layers. In one or more embodiments, the electronic system is selected from the group consisting of a LED-based luminaire, a light emitting strip, a light emitting sheet, an optical display, and a microLED display.

EMBODIMENTS

Various embodiments are listed below. It will be understood that the embodiments listed below may be combined with all aspects and other embodiments in accordance with the scope of the invention.

Embodiment (a). A light emitting diode (LED) device comprising: a mesa comprising semiconductor layers, the semiconductor layers including an n-type layer, an active layer, and a p-type layer; a patterned transparent conductive oxide layer on a top surface of the mesa, the patterned transparent conductive oxide layer having a first portion with a first thickness and a second portion with a second thickness, the second thickness less than the first thickness; a dielectric layer on a top surface of the patterned transparent conductive oxide layer, the dielectric layer comprising at least one via opening, the at least one via opening having sidewalls and a bottom exposing a top surface of the first portion of the patterned transparent conductive oxide layer; and a contact on the dielectric layer and in electrical communication with the first portion of the patterned transparent conductive oxide layer.

Embodiment (b). The LED device of embodiment (a), wherein the first thickness is in a range of from about 1 nm to about 500 nm.

Embodiment (c). The LED device of embodiments (a) to (b), wherein the second thickness is in a range of from about 0 nm to about 500 nm.

Embodiment (d). The LED device of embodiments (a) to (c), wherein the at least one via opening has a width in a range of about 1 micron to about 30 microns.

Embodiment (e). The LED device of embodiments (a) to (d), wherein the second portion has a width in a range of about 1 microns to about 30 microns.

Embodiment (f). The LED device of embodiments (a) to (e), wherein the dielectric layer has a thickness greater than about 300 nm.

Embodiment (g). The LED device of embodiments (a) to (f), wherein the patterned transparent conductive oxide layer comprises one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide.

Embodiment (g). The LED device of embodiments (a) to (f), wherein the contact comprises a material selected from one or more of silver (Ag), aluminum (Al), gold (Au), copper (Cu), palladium (Pd), and platinum (Pt).

Embodiment (h). The LED device of embodiments (a) to (g), wherein the dielectric layer comprises one or more of silicon oxide ($SiO_x$), aluminum oxide ($AlO_x$), silicon nitride (SiN), titanium oxide ($TiO_x$), niobium oxide ($NbO_x$), tantalum oxide ($TaO_x$).

Embodiment (i). A method of manufacturing a light emitting diode (LED) device, the method comprising: depositing a transparent conductive oxide layer on a semiconductor surface; patterning the transparent conductive oxide layer to form a patterned transparent conductive oxide layer having first portion with a first thickness and a second portion with a second thickness; depositing a dielectric layer on the patterned transparent conductive oxide layer; forming a via opening in the dielectric layer; and forming a contact on the dielectric layer and in the via opening, the contact in electrical communication with the patterned transparent conductive oxide layer.

Embodiment (j). The method of embodiment (i), wherein the first thickness is in a range of from about 1 nm to about 500 nm and the second thickness is in a range of from about 0 nm to about 500 nm.

Embodiment (k). The method of embodiments (i) to (j), wherein the via opening has at least one sidewall and a bottom surface, the bottom surface comprising a top surface of the first portion of the patterned transparent conductive oxide layer.

Embodiment (l). The method of embodiments (i) to (k), wherein the second portion has a width in a range of about 2 microns to about 30 microns.

Embodiment (m). The method of embodiments (i) to (l), further comprising treating the patterned transparent conductive oxide layer with one or more of a dry etch treatment and a chemical treatment.

Embodiment (n). The method of embodiments (i) to (m), wherein the chemical treatment comprises treatment with one or more of oxygen ($O_2$), chlorine ($Cl_2$), boron trichloride ($BCl_3$), sulfur hexafluoride ($SF_6$), fluoroform ($CHF_3$), nitrogen ($N_2$), argon ($Ar_2$), hydrochloric acid (HCl), hydrofluoric acid (HF), buffered oxide etchant, ammonia ($NH_4$), hydrogen peroxide ($H_2O_2$), and photoresist stripping chemicals.

Embodiment (o). The method of embodiments (i) to (n), further comprising depositing a film on the patterned transparent conductive oxide layer prior to deposition of the dielectric layer, the film comprising one or more of silicon oxide ($SiO_x$), silicon nitride (SiN), gallium nitride (GaN), and zinc oxide (ZnO).

Embodiment (p). The method of embodiments (i) to (o), further comprising annealing the patterned transparent conductive oxide layer.

Embodiment (q). The method of embodiments (i) to (p), further comprising depositing a second transparent conductive oxide layer and patterning the second transparent conductive oxide layer.

Embodiment (r). The method of embodiments (i) to (q), wherein the patterned transparent conductive oxide layer comprises one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide.

Embodiment (s). A light emitting diode (LED) device comprising: a mesa comprising semiconductor layers, the semiconductor layers including an n-type layer, an active layer, and a p-type layer; a patterned transparent conductive oxide layer on a top surface of the mesa, the patterned transparent conductive oxide layer having a first portion with a first thickness and a second portion with a second thickness, the second thickness less than the first thickness, the patterned transparent conductive oxide layer comprising one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide, the first thickness is in a range of from about 1 nm to about 100 nm and the second thickness is in a range of from about 0 nm to about 50 nm; a dielectric layer on a top surface of the patterned transparent conductive oxide layer, the dielectric layer comprising at least one via opening, the via opening having sidewalls and a bottom exposing a top surface of the first portion of the patterned transparent conductive oxide layer; and a contact on the dielectric layer and in electrical communication with the first portion of the patterned transparent conductive oxide layer.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting diode (LED) device comprising:
   a mesa comprising semiconductor layers, the semiconductor layers including an n-type layer, an active layer, and a p-type layer;
   a patterned transparent conductive oxide layer directly on a top surface of the mesa, the patterned transparent conductive oxide layer having a first portion with a first uniform thickness in a range of from 1 nm to 500 nm and a second portion with a second uniform thickness in a range of from 0 nm to 400 nm, the second thickness less than the first thickness;
   a dielectric layer on a top surface of the patterned transparent conductive oxide layer, the dielectric layer comprising at least one via opening, the at least one via opening having sidewalls and a bottom exposing a top surface of the first portion of the patterned transparent conductive oxide layer; and
   a contact on the dielectric layer and in electrical communication with the first portion of the patterned transparent conductive oxide layer.

2. The LED device of claim 1, wherein the at least one via opening has a width in a range of about 1 micron to about 30 microns.

3. The LED device of claim 1, wherein the second portion has a width in a range of about 1 microns to about 30 microns.

4. The LED device of claim 1, wherein the dielectric layer has a thickness greater than about 300 nm.

5. The LED device of claim 1, wherein the patterned transparent conductive oxide layer comprises one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide.

6. The LED device of claim 1, wherein the contact comprises a material selected from one or more of silver (Ag), aluminum (Al), gold (Au), copper (Cu), palladium (Pd), and platinum (Pt).

7. The LED device of claim 1, wherein the dielectric layer comprises one or more of silicon oxide ($SiO_x$), aluminum oxide ($AlO_x$), silicon nitride (SiN), titanium oxide ($TiO_x$), niobium oxide ($NbO_x$), tantalum oxide ($TaO_x$).

8. A method of manufacturing a light emitting diode (LED) device, the method comprising:
   depositing a transparent conductive oxide layer directly on a semiconductor surface;
   patterning the transparent conductive oxide layer to form a patterned transparent conductive oxide layer having first portion with a first uniform thickness in a range of from 1 nm to 500 nm and a second portion with a second uniform thickness in a range of from 0 nm to 400 nm, the second uniform thickness less than the first uniform thickness;
   depositing a dielectric layer on the patterned transparent conductive oxide layer;
   forming a via opening in the dielectric layer; and
   forming a contact on the dielectric layer and in the via opening, the contact in electrical communication with the patterned transparent conductive oxide layer.

9. The method of claim 8, wherein the via opening has at least one sidewall and a bottom surface, the bottom surface comprising a top surface of the first portion of the patterned transparent conductive oxide layer.

10. The method of claim 8, wherein the second portion has a width in a range of about 2 microns to about 30 microns.

11. The method of claim 8, further comprising treating the patterned transparent conductive oxide layer with one or more of a dry etch treatment and a chemical treatment.

12. The method of claim 11, wherein the chemical treatment comprises treatment with one or more of oxygen ($O_2$), chlorine ($Cl_2$), boron trichloride ($BCl_3$), sulfur hexafluoride ($SF_6$), fluoroform ($CHF_3$), nitrogen ($N_2$), argon ($Ar_2$), hydrochloric acid (HCl), hydrofluoric acid (HF), buffered oxide etchant, ammonia ($NH_4$), hydrogen peroxide ($H_2O_2$), and photoresist stripping chemicals.

13. The method of claim 8, further comprising depositing a film on the patterned transparent conductive oxide layer prior to deposition of the dielectric layer, the film comprising one or more of silicon oxide ($SiO_x$), silicon nitride (SiN), gallium nitride (GaN), and zinc oxide (ZnO).

14. The method of claim 12, further comprising annealing the patterned transparent conductive oxide layer.

15. The method of claim 8, further comprising depositing a second transparent conductive oxide layer and patterning the second transparent conductive oxide layer.

16. The method of claim 8, wherein the patterned transparent conductive oxide layer comprises one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide.

17. A light emitting diode (LED) device comprising:
   a mesa comprising semiconductor layers, the semiconductor layers including an n-type layer, an active layer, and a p-type layer;
   a patterned transparent conductive oxide layer on a top surface of the mesa, the patterned transparent conductive oxide layer having a first portion with a first uniform thickness and a second portion with a second uniform thickness, the second thickness less than the first thickness, the patterned transparent conductive oxide layer comprising one or more of indium-doped tin oxide, aluminum-doped zinc oxide, indium-doped cadmium oxide, indium oxide, tin oxide, tungsten oxide, copper aluminum oxide, strontium copper oxide, gadolinium-doped zinc oxide, and zinc-doped tin oxide, the first uniform thickness is in a range of from about 1 nm to about 100 nm and the second uniform thickness is in a range of from about 0 nm to about 50 nm;
   a dielectric layer directly on a top surface of the patterned transparent conductive oxide layer, the dielectric layer comprising at least one via opening, the via opening having sidewalls and a bottom exposing a top surface of the first portion of the patterned transparent conductive oxide layer; and
   a contact on the dielectric layer and in electrical communication with the first portion of the patterned transparent conductive oxide layer.

18. The LED device of claim 1, wherein the via opening has a bottom surface comprising a top surface of the first portion.

19. The LED device of claim 17, wherein the via opening has a bottom surface comprising a top surface of the first portion.

20. The LED device of claim 1, wherein the first uniform thickness is in a range of from 1 nm to 500 nm, and the second uniform thickness is 0 nm.

21. The LED device of claim 17, wherein the first uniform thickness is in a range of from 1 nm to 500 nm, and the second uniform thickness is 0 nm.

\* \* \* \* \*